United States Patent
Restle et al.

(10) Patent No.: US 9,494,968 B2
(45) Date of Patent: Nov. 15, 2016

(54) CLOCK SKEW ANALYSIS AND OPTIMIZATION

(71) Applicant: International Business Machines Corporation, Armonk, NY (US)

(72) Inventors: Phillip J. Restle, Katonah, NY (US); James D. Warnock, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 515 days.

(21) Appl. No.: 13/742,039

(22) Filed: Jan. 15, 2013

(65) Prior Publication Data

US 2014/0201561 A1      Jul. 17, 2014

(51) Int. Cl.
*G06F 17/50*      (2006.01)
*G06F 1/10*      (2006.01)

(52) U.S. Cl.
CPC .............. *G06F 1/10* (2013.01); *G06F 17/5031* (2013.01)

(58) Field of Classification Search
CPC ................................................... G06F 17/5031
USPC ............................................................ 703/19
See application file for complete search history.

(56) References Cited

U.S. PATENT DOCUMENTS

| | | | |
|---|---|---|---|
| 6,205,571 B1 | 3/2001 | Camporese et al. | |
| 7,191,418 B2 | 3/2007 | Lee et al. | |
| 7,216,322 B2 | 5/2007 | Lai et al. | |
| 7,562,324 B2 | 7/2009 | Chang et al. | |
| 7,937,604 B2 | 5/2011 | Banerji et al. | |
| 8,020,129 B2* | 9/2011 | Abbaspour et al. | 716/113 |
| 8,179,181 B2 | 5/2012 | Lung et al. | |
| 8,180,621 B2* | 5/2012 | Phillips | 703/14 |
| 8,205,182 B1 | 6/2012 | Zlatanovici et al. | |
| 8,886,511 B2* | 11/2014 | Hamdan | 703/19 |
| 2004/0249588 A1* | 12/2004 | Shimazaki et al. | 702/66 |
| 2008/0059143 A1* | 3/2008 | Chiu et al. | 703/14 |
| 2008/0086668 A1* | 4/2008 | Jefferson et al. | 714/741 |
| 2009/0237134 A1* | 9/2009 | Hwang | G06F 1/10 327/165 |
| 2011/0252389 A1 | 10/2011 | Albrecht et al. | |
| 2011/0313738 A1* | 12/2011 | Stamoulis et al. | 703/2 |
| 2012/0133393 A1 | 5/2012 | Matsuoka | |

FOREIGN PATENT DOCUMENTS

EP      2428960 A1      3/2012

OTHER PUBLICATIONS

Mori et al, "A Multiple Level Network Approach for Clock Skew Minimization with Process Variations", IEEE, 2004.*

(Continued)

*Primary Examiner* — Hugh Jones
(74) *Attorney, Agent, or Firm* — Cantor Colburn LLP; Margaret A. McNamara

(57) ABSTRACT

A method for adjusting clock skew in a network is disclosed. A model is fit to a first clock input signal received at a first receiver of the network and to a second clock input signal received at a second receiver of the network to obtain a fitted model. A first response signal is simulated using the fitted model and the first clock input signal and a second response signal is simulated using the fitted model and the second clock input signal. A time difference is determined between the simulated first response signal and the simulated second response signal. A parameter of at least one of the network clock network, the first receiver and the second receiver is altered to adjust the determined time difference.

14 Claims, 5 Drawing Sheets

(56) References Cited

OTHER PUBLICATIONS

Chou et al, "An Effective and Efficient Framework for Clock Latency Range Aware Clock Network Synthesis", IEEE Transactions on Computer Aided Design of Integrated Circuits and Systems, vol. 30, No. 7, Jul. 2011.*

Mustafa, Kal, "Defining Skew, Propagation-Delay, Phase Offset (Phase Error)", Texas Instruments, Application Report, Nov. 2001.*

"Regression Analysis" (downloaded from www.wikipedia.com on May 14, 2015).*

"Interpolation" (downloaded from www.wikipedia.com on May 14, 2015).*

Lung, et al., "Clock Skew Optimization Considering Complicated Power Modes," DATE '10; Proceeding of the Conference of Design, Automation and Test in Europe; pp. 1474-1479, 2010.

Roy, et al., "Analysis of the Impacts of Signal Slew and Skew on the Behavior of Coupled RLC Interconnects for Different Switching Patterns," IEEE Tranactions on Very Large Scale Integration (VLSI) Systems, vol. 18, No. 2, Feb. 2010; pp. 338-342.

Wang, et al., "General Skew Constrained Clock Network Sizing Based on Sequential Linear Programming," IEEE Transaction on Computer-Aided Design of Integrated Circuits and Systems, vol. 24, No. 5, May 2005; pp. 773-782.

* cited by examiner

US 9,494,968 B2

CLOCK SKEW ANALYSIS AND OPTIMIZATION

BACKGROUND

The present disclosure relates to circuit networks and, in particular, to a method of analyzing clock skew in a circuit network.

Circuit networks generally include a plurality of components or receivers coupled to a clock and receiving a clock input signal from a clock network. Due to various differences in clock path, receiver response and other parameters, the receivers tend to record different arrival times of the clock input signals and therefore produce output response signals in response to the clock input signals at different times. The difference between clock input arrival times at the receiver inputs is known as clock skew. In general, optimal network operation requires that clock skew be reduced or removed from the network or deliberately controlled in some particular fashion in order to meet specific design requirements.

SUMMARY

According to one embodiment, a method of adjusting clock slew in a network includes: fitting, with a processor, a model to a first clock input signal received at a first receiver of the network and a second clock input signal received at a second receiver of the network to obtain a fitted model; simulating a first response signal using the fitted model and the first clock input signal and a second response signal using the fitted model and the second clock input signal; determining a time difference between the simulated first response signal and the simulated second response signal; and altering a parameter of at least one of a network clock that produces the first clock input and the second clock input, the first receiver and the second receiver to adjust the determined time difference.

According to another embodiment, a method of synchronizing a first receiver of a network to a second receiver of a network includes: selecting, by a processor, a model that relates a clock input signal received at a first receiver of the network to a response signal of the first receiver; fitting the selected model to measured times relating to the clock input signal; simulating a response signal of the first receiver using the fitted model; and altering a parameter of at least one of a clock network, the first receiver and the second receiver to adjust a time difference between the simulated response signal and a response signal of the second receiver.

According to another embodiment, a computer program product includes a computer readable storage medium having computer readable program code embodied therewith, the computer readable program code comprising instructions, that when executed by a computer, implement a method of adjusting clock skew in a network, wherein the method comprises: fitting a model to a first clock input signal received at a first receiver of the network and a second clock input signal received at a second receiver of the network to obtain a fitted model; simulating a first response signal using the fitted model and the first clock input signal and a second response signal using the fitted model and the second clock input signal; determining a time difference between the simulated first response signal and the simulated second response signal; and altering a parameter of at least one of a network clock, the first receiver and the second receiver to adjust the determined time difference.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features and advantages of the disclosure are apparent from the following detailed description taken in conjunction with the accompanying drawings in which:

DETAILED DESCRIPTION

Figure 1:
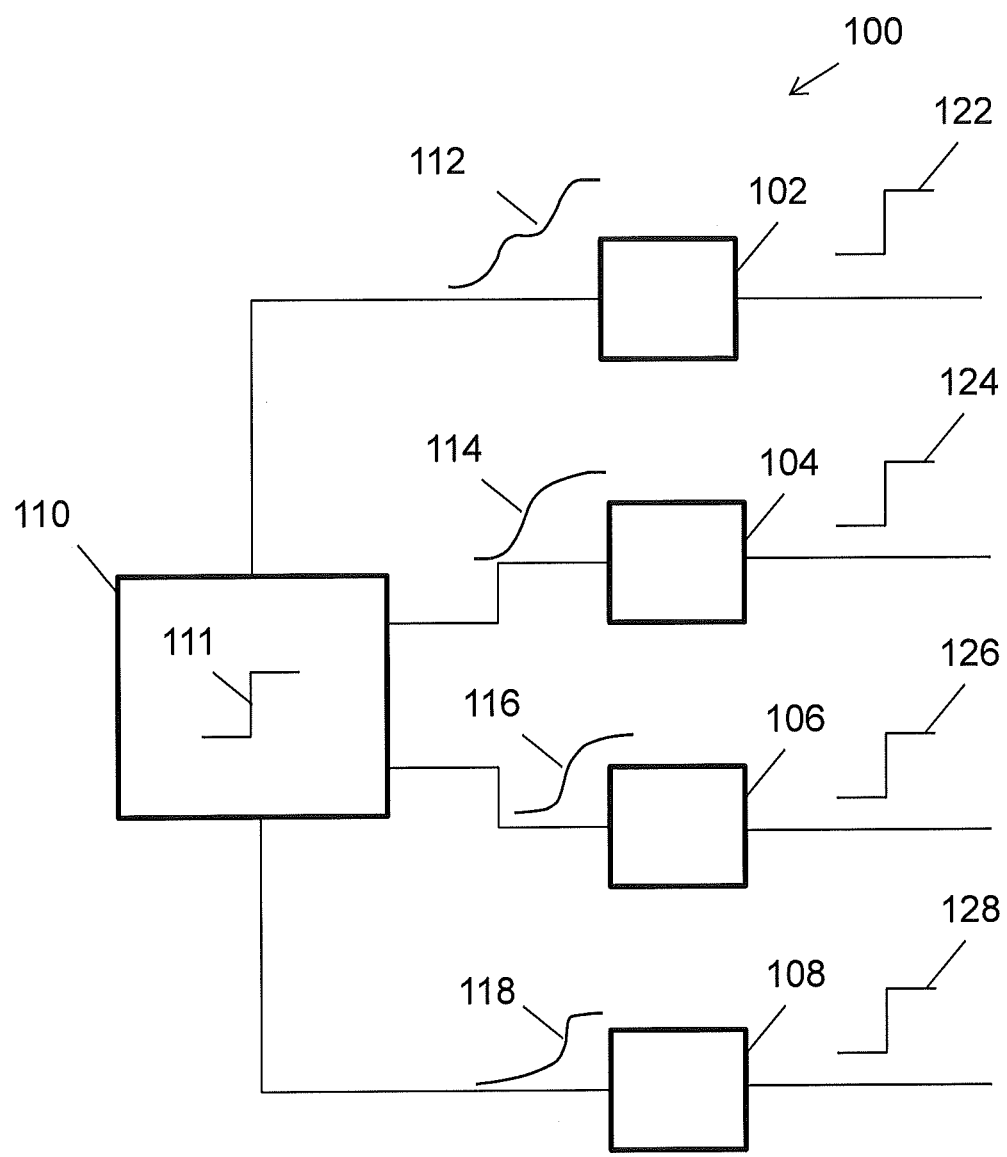
FIG. 1 shows an exemplary network of receivers that receive a clock input signal from a clock network.

FIG. 1 shows an exemplary network 100 of receivers that receive a clock input signal from a clock. The exemplary network includes a clock 110 that provides the clock input signals to the network of receivers 102, 104, 106, 108, wherein each receiver is coupled to the clock 110 via a clock signal path. The clock 110 may be referred to as a network clock. A receiver such as exemplary receivers 102, 104, 106 and 108 may refer to any network element that receives an input signal and produces an output signal in response. For illustrative purposes only, the exemplary network 100 is shown to include four receivers. However, other networks suitable for use with the methods disclosed herein may include any number of receivers and in some cases include receivers numbering in the hundreds or thousands or more. The clock 110 produces a clock signal 111 that rises from a low voltage to a high voltage at a selected time. Due to differences in various parameters along the clock signal paths, clock signal 111 arrives at the receivers having the displayed waveforms of clock input signals 112, 114, 116 and 118. The waveforms of the clock input signals 112, 114, 116 and 118 may therefore differ from the original waveform of clock signal 111 as well as from each other and may arrive at the receivers at different times. Each receiver 102, 104, 106 and 108 of the exemplary network 100 produces a response signal (i.e., 122, 124, 126 and 128, respectively) in response to their respective clock input signals 112, 114, 116 and 118. The differences in the waveforms of the received clock input signals 112, 114, 116 and 118 as well as differences in their arrival times at their respective receivers 102, 104, 106 and 108 may therefore result in one receiver producing a response signal at a different time than a response signal of the other receivers, thereby resulting in a skew in the output responses of the receivers. Prior methods focus on ways to even out the arrival times of the clock inputs at the receivers in order to reduce the clock input skew and thereby the receiver output skew. However, if the clock input waveforms are different at each receiver input, the receiver outputs will not be synchronous even when all the clock inputs arrive at the same time. Thus, prior methods are therefore lacking in accuracy since they do not directly address the skew at the receiver outputs.

Figure 2:
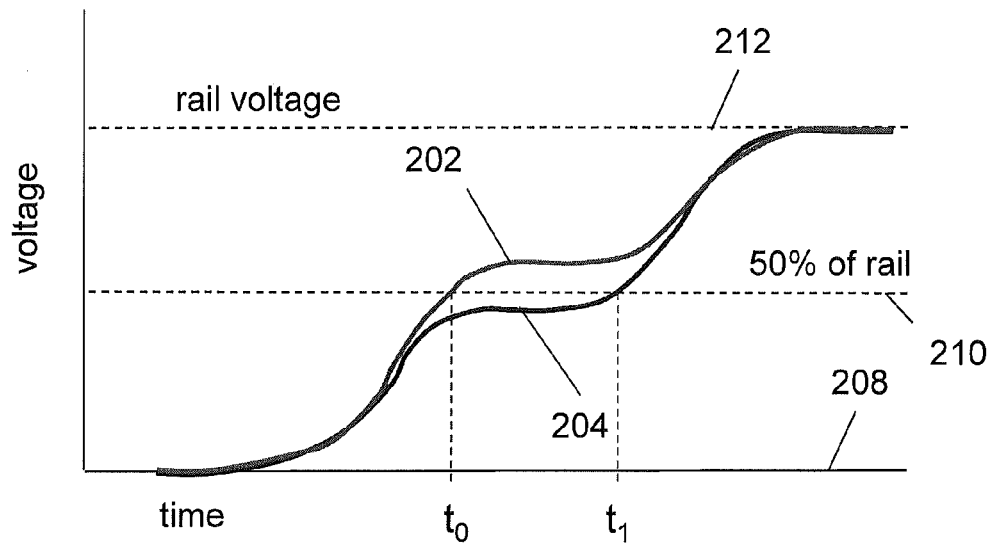
FIG. 2 shows two clock input signals that may be received at exemplary receivers of the exemplary network.

FIG. 2 shows two clock input signals 202 and 204 that may be received at exemplary receivers of the exemplary network 100. Clock input signal 202 may be received at one receiver and clock input signal 204 may be received at another receiver. The clock input signals increase from a low voltage 208 which is generally zero volts to a high voltage 212 referred to herein as the rail voltage. An exemplary reference voltage level 210 is shown that is 50% of the rail voltage 212. However, the reference voltage may be any selected voltage level. Although the clock input signals 202 and 204 increase from the low voltage 208 substantially simultaneously and reach the rail voltage 212 substantially simultaneously, they clearly cross the reference voltage 210 at distinctly different times. Clock input signal 202 crosses the reference voltage 210 at time $t_0$ and then experiences a plateau above the reference voltage before ascending to the rail voltage 212. Clock input signal 204, after experiencing a plateau, crosses the reference voltage 210 at time $t_1$ and rises to the rail voltage 212. Thus, using the crossing time at reference voltage 210 as the definition of the clock arrival time, as is common practice in the industry, clock input signals 202 and 204 are calculated to have significantly different arrival times at their respective receivers. However, the output responses of the receivers are similar with similar timing, since the two input waveforms are substantially similar.

Figure 3:
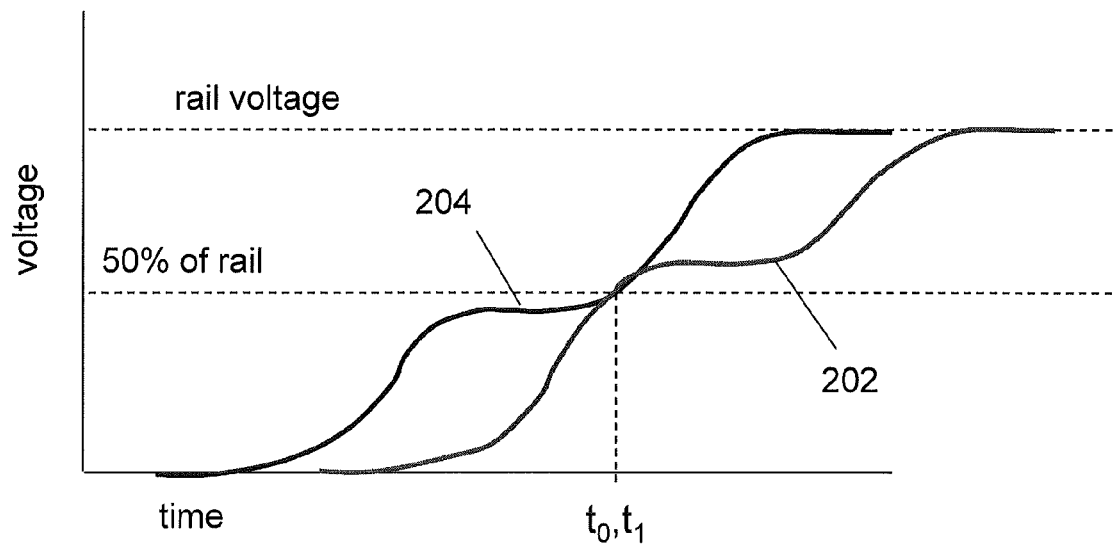
FIG. 3 illustrates a method of correcting arrival times of the two clock input signals of FIG. 2 using current methods.

FIG. 3 (Prior Art) illustrates a known method for correcting arrival times of the two clock input waveforms 202 and 204 using current methods. The clock input waveforms 202 and 204 are adjusted so as to line up their arrival times ($t_0$ and $t_1$). These waveforms may be adjusted in time using techniques that are well known in the industry, including tuning of network wire widths and lengths, adjusting clock buffer strengths, adding delay elements or by other methods. Such methods cause the receiver responses to occur at substantially different times, where the receiver with clock input 202 produces an output response considerably later than the receiver with clock input 204. This time difference results from the fact that, although waveforms 202 and 204 have similar shape (differing only slightly in the "plateau region"), prior methods of time adjustment causes input waveform 202 to occur later than input waveform 204 at almost every measurement voltage. Therefore, aligning waveforms with respect to any particular reference voltage (i.e., 50% rail voltage) does not necessarily produce the best alignment of the arrival times of the clock input signals. If the clock network is adjusted using current methods, the effective clock skew after adjustment will still be non-zero, since the output responses of the receivers will occur at different times due to differing input clock waveform shapes, as illustrated in FIG. 3.

Figure 4:
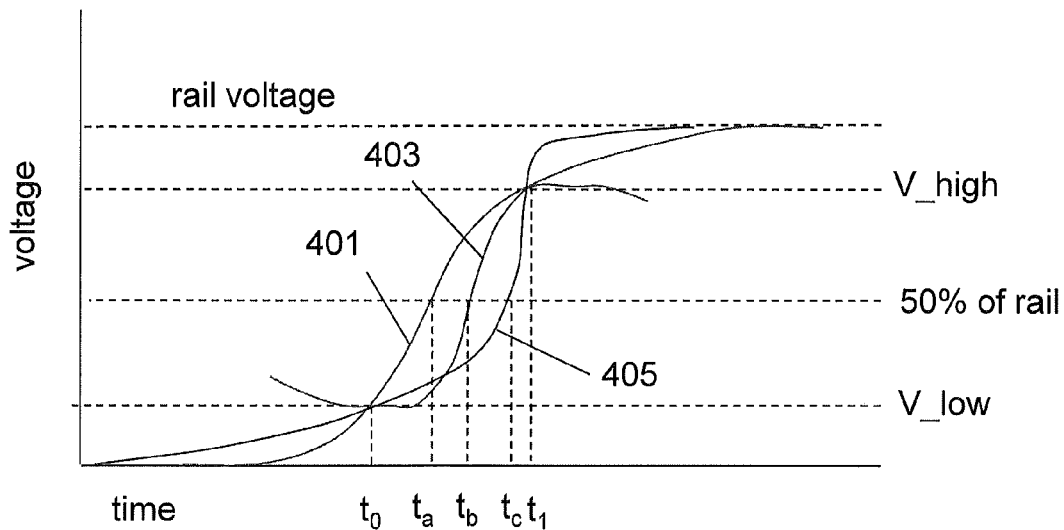
FIG. 4 shows a plurality of exemplary clock signals having different waveform shapes.

FIG. 4 (Prior Art) shows a plurality of exemplary clock input signals having different waveform shapes and illustrates limitations of using a standard metric such as slew to describe the shape of the waveform. Slew is a metric that specifies a duration of time from when the signal reaches one specified voltage level to when it reaches another specified level. An example of these two specified voltage levels could be 10% of the rail voltage and 90% of the rail voltage. However, the choice of these two voltage crossing points is somewhat arbitrary. For example, voltage crossing points at 20% and 80% of the rail voltage or at 30% and 70% of the rail voltage have often been used for slew characterization in addition to the 10% and 90% method described above. The choice of the two voltage crossing points affects the numeric value of slew. Each of the exemplary clock input signals 401, 403 and 405 has the same slew as measured at the voltage levels $V_{high}$ and $V_{low}$. However, the overall shape of the waveform of each clock input signal is vastly different and the receiver output response times, when driven with these different inputs, are quite different, even when the inputs are lined up such that they all cross the reference voltage at the same time. Therefore, the slew of the clock input signal may be a poor indicator of how a receiver responds to the clock input signal.

The present disclosure provides a method of providing a response at a receiver output to a clock input signal that estimates the output response from clock input signals having a potential variety of waveforms. In one embodiment, the present disclosure provides a method of synchronizing responses that are produced at a plurality of receivers in order to reduce the effective clock skew by minimizing the skew in the predicted output response signals. In an exemplary embodiment, the present disclosure fits a mathematical function describing the receiver output to the parameters of the clock input signals. A variety of representative clock input signals may be measured at several receiver inputs and parameterized according to the times at which they cross specified voltage levels. A regression analysis may be used to fit the function describing the receiver output to the simulated receiver response or to a plurality simulated responses from a plurality of receivers. The plurality of simulated responses may correspond to input clock signals having a plurality of waveforms. For each input clock signal, the measured parameters of the input clock signal may be used as independent variables of the function. In general, the mathematical function may be expressed as a function of differences in the measured voltage level crossing times from some reference time (i.e. the time at which the input signal crosses a reference voltage). It is expected that the receiver response time, which is also measured as a difference from the time at which the input signal crosses the reference voltage, is independent of the absolute time at which the input signal is received. A plurality of clock input signals may be used, since the input clock waveform may vary from receiver to receiver. However, the waveform of a clock input signal at a selected receiver is substantially the same for any preceding or subsequent clock cycle.

Figure 5:
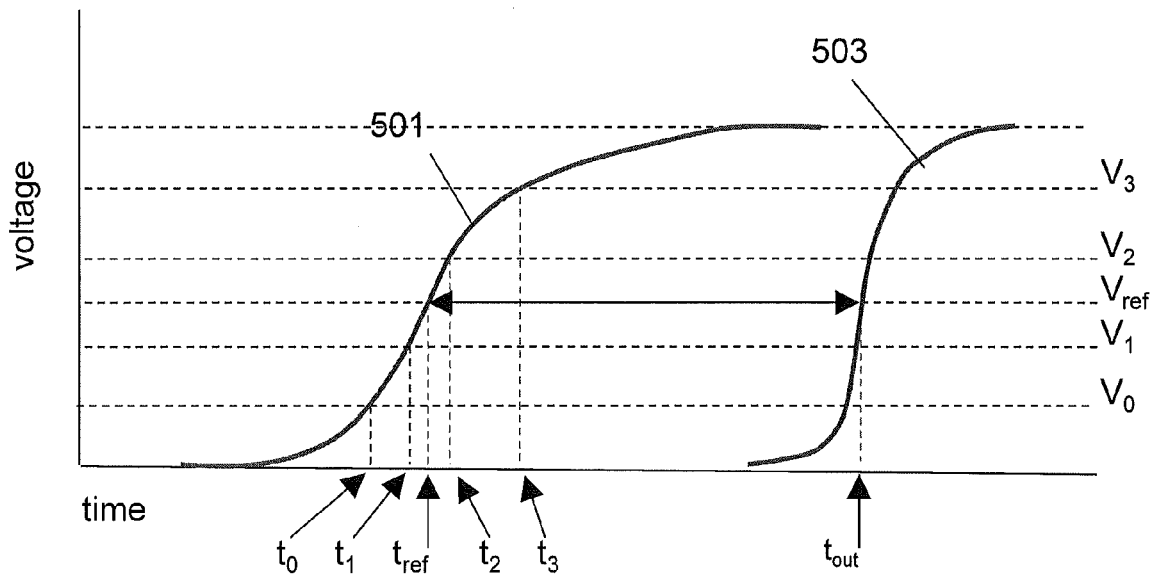
FIG. 5 illustrates an exemplary method of fitting a function to an exemplary clock input signal in one embodiment of the present disclosure.

FIG. 5 illustrates an exemplary method of fitting a function to an exemplary clock input signal. The exemplary clock input waveform 501 rises from a low voltage (i.e., zero volts) to a high voltage (i.e., rail voltage). A number of voltage levels are used in the model. The voltage levels may be selected and their particular voltage levels specified to provide an acceptable description of the input waveform. Times are measured when the clock input signal crosses the selected voltage levels. During its rise, the exemplary clock input signal 501 crosses voltage level $V_0$ at $t_0$, crosses voltage level $V_1$ at $t_1$, crosses voltage level $V_2$ at $t_2$, crosses voltage level $V_3$ at $t_3$, and crosses voltage level $V_{ref}$ at $t_{ref}$. $V_{ref}$ may or may not be 50% of the rail voltage in various embodiments. The number of voltage levels shown in FIG. 5 is only an illustrative number. Any number of voltage levels may be selected depending on the desires of an operator. Increasing the number of voltage levels generally increases the accuracy of the model. Changing the placement of the voltage levels may also affect the accuracy of the model. For example, if the receiver response is sensitive to the clock input signal over a particular range of voltages, the spacing between selected measuring voltage levels may be reduced over this range of voltages to increase the accuracy of the model.

The crossing times $t_0$, $t_1$, $t_2$, $t_3$ and $t_{ref}$ may be measured in order to characterize the waveform in question in terms of a small number of timing parameters. A time delay between clock input signal 501 and response signal 503 may be written as a function of differences in the measured crossing times, as shown in Eq. (1):

$$t_{out} - t_{ref} = F\{(t_0 - t_{ref}), (t_1 - t_{ref}), (t_2 - t_{ref}), (t_3 - t_{ref})\} \qquad \text{Eq. (1)}$$

where $t_{out} - t_{ref}$ represents a time delay between time $t_{ref}$ at which the clock input signal 501 crosses the $V_{ref}$ voltage level and time $t_{out}$ at which the receiver response 503 crosses the $V_{ref}$ voltage level. In an exemplary embodiment, the function of Eq. (1) may be a linear function, as shown for example in Eq. (2):

$$t_{out} - t_{ref} = A + a_0(t_0 - t_{ref}) + a_1(t_1 - t_{ref}) + a_2(t_2 - t_{ref}) + a_3(t_3 - t_{ref}) \qquad \text{Eq. (2)}$$

where A is a constant term and $a_0$, $a_1$, $a_2$ and $a_3$ are coefficients of the selected time intervals. The functional form of Eq. (1) may be simpler or more complicated than the linear form of Eq. (2), may include non-linear terms, etc. In an exemplary embodiment, the time delay $t_{out} - t_{ref}$ relates the clock input signal to a receiver response that has a constant slew with respect to the clock input signal. In an alternate embodiment in which the slew of the response signal is not constant but is translatable to a specified delay time change in downstream circuitry, a term representing this delay time change may be included in the mathematical function. Also, any predictable variations of the receiver response may be included in the model using a suitable term. Such predictable variations may include, for example, different output loads of the receivers. Additional delay terms may include a simple delay parameter, a setup time, a hold time or any other network timing specification, for example.

Once the format of the model, i.e., the mathematical function, has been selected, the model is fit to data points obtained from one or more representative clock input signals. The representative clock input signals may be actual clock input signals or simulated clock input signals. For each waveform, the individual time offset parameters ($t_n - t_{ref}$ where n=0, 1, 2, 3, . . . ) are determined and the response time delay ($t_{out} - t_{ref}$) may be determined from a simulated response of the receiver. A least-squares regression may be used to fit the modeled (simulated) time delay response to a plurality of actual responses for the representative clock input signals (i.e. for all the different sets of time-offset parameters) by determining values of the coefficients, i.e., A, $a_0$, $a_1$, $a_2$, etc. Regression methods besides least-squares regression may also be used in alternate embodiments. Once suitable coefficients are determined, a simulated response may be produced using the fitted model. The simulated response is compared to an actual response to determine the suitability of the model. In an exemplary embodiment, a standard deviation may be used to determine a variability of the time delay, where $$SD(t_{out} - t_{ref}) = F\{(t_0 - t_{ref}), (t_1 - t_{ref}), (t_2 - t_{ref}), (t_3 - t_{ref})\} \qquad \text{Eq. (3)}$$

Once a suitable fitted model is selected, the selected fitted model may be used to quantify clock skew in a network. Using simulated responses, the disclosed method may be used to correct for the effective clock skew at different points on the receiver network by automatically compensating for the effects of the varying clock waveforms at the inputs of the different receivers.

Figure 6:
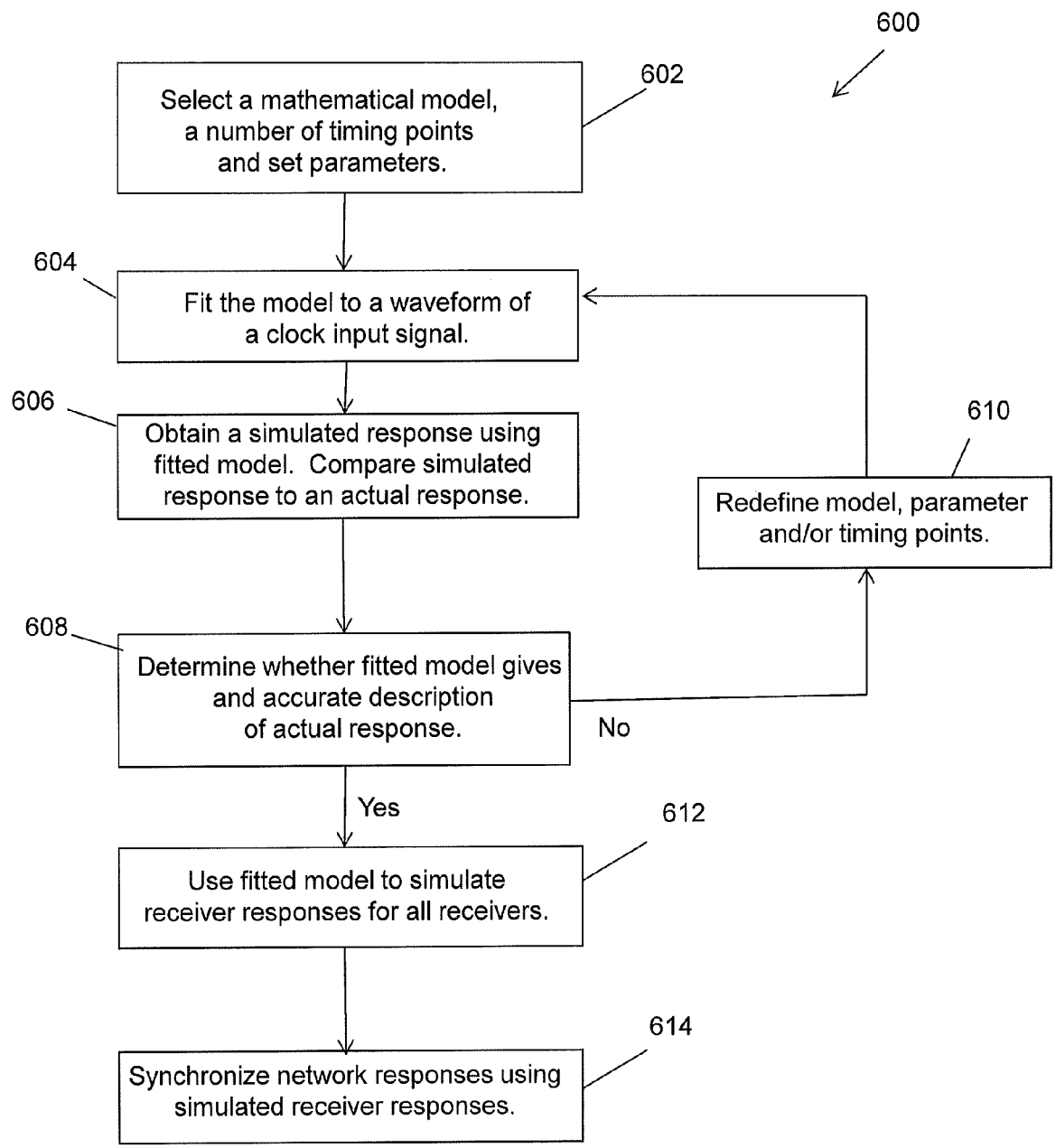
FIG. 6 shows a flowchart illustrating an exemplary method of reducing clock skew in a network of receivers.

FIG. 6 shows a flowchart illustrating an exemplary method of reducing the effective clock skew in a network of receivers. In box 602, a model or mathematical function (i.e., the exemplary function of Eq. (1)) is defined to relate a clock input signal at a receiver to a resultant receiver response. Defining the model may include selecting the model, selecting a number of parameters, such as a number of measurement voltage levels (i.e., voltage levels $V_0$, $V_1$, $V_2$ and $V_3$ and $V_{ref}$) and specifying their voltage levels. In box 604, at least one clock input signal is received and the model is fit to the received clock input signal(s). In particular, voltage crossing times (i.e., $t_0$, $t_1$, $t_2$, $t_3$ and $t_{ref}$) are measured and the model is fit to the clock input signals using the voltage crossing times. In various embodiments, a regression analysis, such as a least squares analysis, is used to determine the coefficients of the model, i.e., A, $a_0$, $a_1$, $a_2$, etc. In box 606, a simulated response is obtained using the fitted model, and the simulated response is compared to an actual response obtained at the receiver for a number of input clock waveforms. The waveforms may include some or all of the waveforms used originally in the model fitting procedure along with any other relevant waveforms. In an exemplary embodiment, the comparison may include determining differences between the simulated response time and the modeled response time and using the determined differences to obtain difference values for each input clock waveform of interest. In box 608, the difference values are compared to a selected criterion to determine whether the simulated response is an accurate description of the actual response. If the difference value is greater than the selected criterion, the simulated response is considered a non-accurate description and the method proceeds to box 610. In box 610, the model, parameter and/or timing points are redefined before returning to box 604 to fit the model to the clock input signals at box 604. Returning to box 608, if the difference value is less than or equal to the selected criterion, the simulated response is considered an accurate description of the actual response and the method proceeds to box 612. In box 612, the model is used to predict receiver responses for all receivers. In box 614, the network response signals may be synchronized using the modeled receiver response. In other words, the clock skew is adjusted or reduced using the modeled receiver response. In various embodiments, synchronizing the network response signals may include adjusting a parameter of the network clock, adjusting a parameter of at least one of the receivers, adjusting a buffer, adjusting a wire length, etc.

In an exemplary embodiment, the mathematical function may be written as a linear model having timing points that are chosen at 10%, 50% and 90% of the rail voltage, to obtain Eq. (3):

$$t_{out} - t_{ref} = A + a_0(t_{10} - t_{ref}) + a_1(t_{90} - t_{ref}) \qquad \text{Eq. (4)}$$

Additionally, Eq. (4) may be reduced using $a_0 = -a_1$ to obtain $$t_{out} - t_{ref} = A + a_1(t_{90} - t_{10}) \qquad \text{Eq. (5)}$$

Thus in one embodiment, the slew as measured between the selected voltages of 10% to 90% rail voltage may be used to determine response delay. However, other selected voltage levels may also be used in alternate embodiments.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Figure 7:
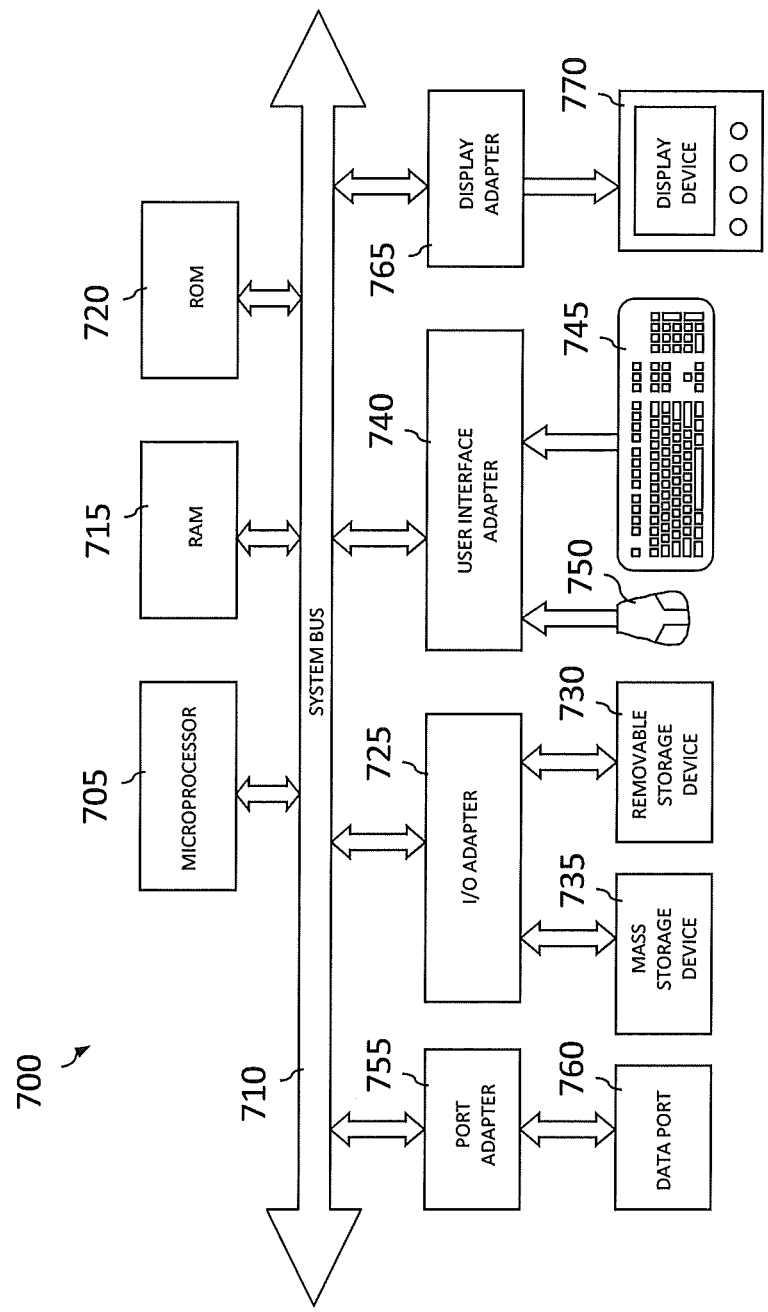
FIG. 7 is a schematic block diagram of a general-purpose computing system suitable for practicing embodiments of the present invention.

Generally, the method embodiments for implementing systematic, variation-aware integrated circuit extraction may be practiced with a general-purpose computer and the method may be coded as a set of instructions on removable or hard media for use by the general-purpose computer. FIG. 7 is a schematic block diagram of a general-purpose computing system suitable for practicing embodiments of the present invention. In FIG. 7, computing system 700 has at least one microprocessor or central processing unit (CPU) 705. CPU 705 is interconnected via a system bus 710 to a random access memory (RAM) 715, a read-only memory (ROM) 720, an input/output (I/O) adapter 725 for a connecting a removable data and/or program storage device 730 and a mass data and/or program storage device 735, a user interface adapter 740 for connecting a keyboard 745 and a mouse 750, a port adapter 755 for connecting a data port 760 and a display adapter 765 for connecting a display device 770.

ROM 720 contains the basic operating system for computing system 700. The operating system may alternatively reside in RAM 715 or elsewhere as is known in the art. Examples of removable data and/or program storage device 730 include magnetic media such as floppy drives and tape drives and optical media such as CD ROM drives. Examples of mass data and/or program storage device 735 include hard disk drives and non-volatile memory such as flash memory. In addition to keyboard 745 and mouse 750, other user input devices such as trackballs, writing tablets, pressure pads, microphones, light pens and position-sensing screen displays may be connected to user interface 740. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 730, fed through data port 760 or typed in using keyboard 745.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIGS. 1-6.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

While the exemplary embodiment to the disclosure had been described, it will be understood that those skilled in the art, both now and in the future, may make various improvements and enhancements which fall within the scope of the claims which follow. These claims should be construed to maintain the proper protection for the disclosure first described.

What is claimed is:

1. A method of adjusting clock skew in a network, comprising:
   for each of a plurality of clock input signals having different waveforms at a first receiver, measuring crossing times at which the clock input signal crosses a plurality of defined voltages and a time delay between the clock input signals and a response signal at the first receiver, wherein the clock input signals at the first receiver correspond to a clock signal of the network clock;
   using a processor to determine parameters of an equation that represents the time delay as a function of the crossing times for the clock input signal;
   simulating a time delay for an output response signal from a second receiver using the parametrized equation;
   determining a time difference between the simulated time delay at the second receiver with an actual time delay between a clock input signal and a response signal at the second receiver; and
   adjusting the clock skew by altering a parameter of at least one of the network clock, the first receiver and the second receiver to adjust the determined time difference.

2. The method of claim 1, wherein the equation is a function of differences between the measured crossing times.

3. The method of claim 1, further comprising determining the parameters using a regression analysis on the plurality of clock input signals.

4. The method of claim 1, further comprising comparing a simulated output response signal and to an actual response at the first receiver to determine a suitability of the parameterized equation.

5. The method of claim 4, further comprising performing one of: (i) redefining the voltage thresholds; (ii) using a different equation; and (iii) using a different number of defined voltage thresholds, when a difference between the simulated output response and the actual response is greater than a selected criterion.

6. The method of claim 5, further comprising determining a standard deviation of the time delay between the plurality of clock input signals and their corresponding output response signals.

7. The method of claim 1, wherein altering the parameter further comprises altering at least one of: a clock buffer; a wire; a set-up time; a hold time; and a slew of a response.

8. A method of synchronizing a first receiver of a network to a second receiver of a network, comprising:
measuring crossing times at which clock input signals having a first plurality of waveforms received at the first receiver of the network cross a plurality of defined voltages and a time delay between the clock input signals and corresponding response signals at the first receiver;
using a processor to:
determine parameters of an equation that represents the time delay as a function of the crossing times for the clock input signals;
simulate a time delay for an output response signal from a second receiver using the parametrized equation;
determine a time difference between the simulated time delay at the second receiver with an actual time delay between an input signal and a response signal at the second receiver; and
alter a parameter of at least one of a clock network, the first receiver and the second receiver to adjust the time delay between the simulated output response signal and a response signal of the second receiver.

9. The method of claim 8, further comprising fitting the equation to the measured crossing times using a regression analysis.

10. The method of claim 8, further comprising performing at least one of: selecting another equation; altering a number of defined voltage levels; and altering a placement of the defined voltage levels, when the determined difference is greater than a selected criterion.

11. A computer program product comprising:
a non-transitory computer readable storage medium having computer readable program code embodied therewith, the computer readable program code comprising instructions, that when executed by a computer, implement a method of adjusting clock skew in a network, wherein the method comprises:
measuring crossing times at which a plurality of clock input signals having different waveforms received at a first receiver of the network crosses a plurality of defined voltages and a time delay between the plurality of clock input signals and corresponding response signals at the first receiver, wherein the first plurality of clock input signals correspond to a clock signal of the network clock;
determining parameters of an equation that represents the time delay as a function of the crossing times for the plurality of clock input signals;
simulating a time delay for an output response signal from a second receiver using the parametrized equation;
determining a time difference between the simulated time delay at the second receiver with an actual time delay between an input signal and a response signal at the second receiver; and
adjusting the clock skew by altering a parameter of at least one of the network clock, the first receiver and the second receiver to adjust the determined time difference.

12. The computer program product of claim 11, wherein the method further comprises performing at least one of: selecting another equation; altering a number of defined voltage levels; and altering a placement of the defined voltage levels, when the determined difference is greater than a selected criterion.

13. The computer program product of claim 11, wherein the method further comprises determining a standard deviation of a delay time between clock input signals and output response signals.

14. The computer program product of claim 11, wherein the method further comprises fitting the equation to the measured times using a regression analysis.

* * * * *